(12) United States Patent
Cho et al.

(10) Patent No.: US 9,857,412 B2
(45) Date of Patent: Jan. 2, 2018

(54) ELECTRONIC DEVICE AND A METHOD FOR DETECTING A SHIELD STATE IN AN ELECTRONIC DEVICE

(71) Applicant: Samsung Electronics Co., Ltd., Suwon-si, Gyeonggi-do (KR)

(72) Inventors: Se-Hyun Cho, Yongin-si (KR); Dong-Il Son, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 206 days.

(21) Appl. No.: 14/462,965

(22) Filed: Aug. 19, 2014

(65) Prior Publication Data

US 2015/0301097 A1  Oct. 22, 2015

(30) Foreign Application Priority Data

Apr. 17, 2014  (KR) .................. 10-2014-0046182

(51) Int. Cl.
*G01R 31/14* (2006.01)
*G01R 31/28* (2006.01)
*G01R 31/00* (2006.01)

(52) U.S. Cl.
CPC ....... *G01R 31/2817* (2013.01); *G01R 31/002* (2013.01)

(58) Field of Classification Search
CPC .................. G01R 31/021; G01R 19/16566

USPC ......................................................... 324/509
See application file for complete search history.

(56) References Cited

U.S. PATENT DOCUMENTS

| | | | | |
|---|---|---|---|---|
| 4,091,818 | A * | 5/1978 | Brownlee | A61N 1/37 607/9 |
| 5,448,092 | A * | 9/1995 | Okabe | H01L 27/0248 257/173 |
| 2008/0093925 | A1* | 4/2008 | Kobayashi | B60R 21/01532 307/10.1 |
| 2010/0274099 | A1* | 10/2010 | Telfort | A61B 5/6843 600/300 |
| 2011/0091051 | A1* | 4/2011 | Thomason | G06F 1/1616 381/103 |
| 2011/0185097 | A1* | 7/2011 | Diab | G06F 13/00 710/300 |
| 2013/0153286 | A1 | 6/2013 | Kim et al. | |
| 2013/0221988 | A1* | 8/2013 | Grunthaner | G01R 31/021 324/627 |

FOREIGN PATENT DOCUMENTS

KR  10-2013-0068901 A  6/2013

\* cited by examiner

*Primary Examiner* — Patrick Assouad
*Assistant Examiner* — Demetrius Pretlow
(74) *Attorney, Agent, or Firm* — Jefferson IP Law LLP (57) ABSTRACT

An electronic device and a method for determining a shield state in an electronic device are provided. The method includes at a detecting pad, detecting an electrical signal corresponding to a contact state of a shielding that contacts a ground or the detecting pad, and determining a shield state by the shielding based on the detected electrical signal.

21 Claims, 8 Drawing Sheets

US 9,857,412 B2
ELECTRONIC DEVICE AND A METHOD FOR DETECTING A SHIELD STATE IN AN ELECTRONIC DEVICE

CROSS-REFERENCE TO RELATED APPLICATION(S)

This application claims the benefit under 35 U.S.C. §119 (a) of a Korean patent application filed on Apr. 17, 2014 in the Korean Intellectual Property Office and assigned Serial number 10-2014-0046182, the entire disclosure of which is hereby incorporated by reference.

TECHNICAL FIELD

The present disclosure relates to an electronic device and a method for detecting a shield state in an electronic device. More particularly, the present disclosure relates to a method for detecting a shield state in an electronic device by performing fault analysis of an assembly process of the electronic device.

BACKGROUND

An electronic device includes various components including Radio Frequency (RF) components for RF communication. However, the components may generate noise, and the noise may have an influence on the other components included in the electronic device. In order to prevent noise from having an influence on other components, a shielding which is an electric conductor is applied on a Printed Circuit Board (PCB) of the electronic device. By exposing a ground of the PCB and applying the shielding on the exposed ground, the components can be shielded.

Generally, a performance test of an electronic device is conducted after an assembly process including a shielding process is completed. However, such fault analysis may cause process loss.

Therefore, a need exists for an electronic device and a method for detecting a shield state in an electronic device by performing fault analysis of an assembly process of the electronic device.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method for performing fault analysis while reducing process loss.

Another aspect of the present disclosure is to provide a method for determining a shield state of a shield structure in a shielding assembly process.

In accordance with an aspect of the present disclosure, an operation method of an electronic device is provided. The operation method includes at a detecting pad, detecting an electrical signal corresponding to a contact state of a shielding that contacts a ground or the detecting pad and determining a shield state by the shielding based on the detected electrical signal.

In accordance with another aspect of the present disclosure, an electronic device is provided. The electronic device includes a detecting pad, a ground, and a shielding, wherein the shielding contacts the detecting pad and the ground, and the detecting pad determines a contact state between the shielding, the detecting pad, and the ground.

In accordance with another aspect of the present disclosure, an electronic device is provided. The electronic device includes a detecting pad, a ground, and a shielding, wherein the shielding contacts the detecting pad and the ground, and the detecting pad determines a contact state between the shielding, the detecting pad, and the ground.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

While the present disclosure is susceptible to various modifications and alternative forms, specific embodiments thereof are shown by way of example in the drawings and will herein be described. It should be understood, however, that there is no intent to limit the disclosure to the particular forms disclosed, but on the contrary, the disclosure is to cover all modifications, equivalents, and alternatives falling within the spirit and scope of the disclosure. Like numbers refer to like elements throughout the description of the figures.

It will be understood that the terms "comprises", "may comprise,", "includes" and/or "may include", when used herein, specify the presence of stated functions, operations, and/or components, but do not preclude the presence or addition of one or more other functions, operations, and/or components. It will be further understood that the terms "comprises" or "has", when used herein, specify the presence of stated features, integers, operations, operations, elements, components and/or groups thereof, but do not preclude the presence or addition of one or more other features, integers, operations, operations, elements, components, and/or groups thereof.

As used herein, the term "or" includes any and all combinations of one or more of the associated listed items. For example, "A or B" may include A, B, or both A and B.

It will be understood that, although the terms first, second, and the like, may be used herein to describe various components, these components should not be limited by these terms. For example, the terms do not limit the order and/or importance of the components. These terms are only used to distinguish one component from another. For example, a first user device and a second user device that are user devices indicate different user devices. For example, a first component could be termed a second component, and, similarly, a second component could be termed a first component, without departing from the scope of the present disclosure.

It will be understood that when a component is referred to as being "connected" or "coupled" to another component, it can be directly connected or coupled to the other component or intervening components may be present. In contrast, when a component is referred to as being "directly connected" or "directly coupled" to another component, there are no intervening components present.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A shield state determining device to which various embodiments of the present disclosure can be applied may be included in an electronic device, or provided as a separate device configured to determine a shield state of an electronic device.

The electronic device to which various embodiments of the present disclosure can be applied may be a device with communication capabilities. For example, the electronic device may be at least one of a smart phone, a tablet Personal Computer (PC), a mobile phone, a video phone, an e-Book reader, a desktop PC, a laptop PC, a Netbook computer, a Personal Digital Assistant (PDA), a Portable Multimedia Player (PMP), a Motion Pictures Expert Group (MPEG-1 or MPEG-2) Audio Layer 3 (MP3) player, a mobile medical equipment, a camera, or a wearable device (for example, a Head-Mounted-Device (HMD), such as electronic glasses, electronic clothes, an electronic bracelet, an electronic necklace, an electronic Appcessory, an electronic tattoo, a smart watch, and the like).

According to some embodiments of the present disclosure, the electronic device may be a smart home appliance with a communication capacity. The smart home appliance may be at least one of a Television (TV), a Digital Versatile Disk (DVD) player, audio equipment, a refrigerator, an air conditioner, a cleaner, an oven, a microwave, a washing machine, an air cleaner, a set-top box, a TV box (for example, Samsung HomeSync™, Apple TV™, Google TV™, or the like), game consoles, electronic dictionary, a camcorder, or an electronic album.

According to some embodiments of the present disclosure, the electronic device may be at least one of various medical equipment (for example, Magnetic Resonance Angiography (MRA), Magnetic Resonance Imaging (MRI), Computed Tomography (CT), medical camcorder, ultrasonic equipment, and the like), a navigation device, a Global Positioning System (GPS) receiver, an Event Data Recorder (EDR), a Flight Data Recorder (FDR), an automotive infotainment device, electronic equipment for ship (for example, marine navigation device, gyro compass, and the like), avionics, security equipment, a head unit for vehicle, an industrial or home robot, an Automatic Teller Machine (ATM) of bank, or a Point of Sales (PoS) of store.

According to some embodiments of the present disclosure, the electronic device may be at least one of furniture or part of building/structure with communication capabilities, an electronic board, an electronic signature receiving device, a projector, or various metering equipment (for example, water, electricity, gas, or waves metering equipment). The electronic device may be one of the aforementioned devices or a combination of one or more of the aforementioned devices. In addition, the electronic device may be a flexible device. It will be apparent to those of ordinary skill in the art that the electronic device is not limited to the aforementioned devices. In the following description, the term "user" may indicate a person or an apparatus (for example, an intelligent electronic device) that uses the electronic device.

Figure 1A:
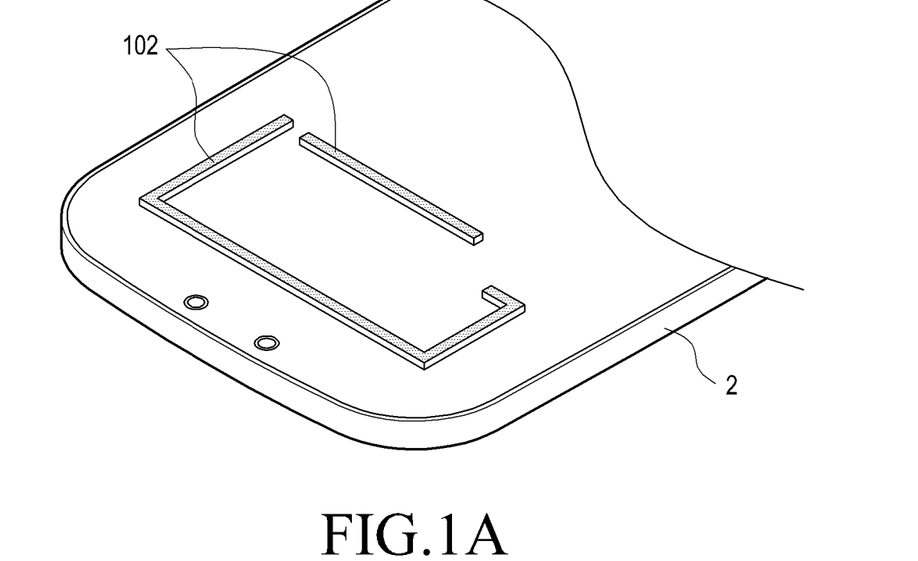
FIGS. 1A and 1B illustrate various shield structures according to an embodiment of the present disclosure.
Figure 1B:
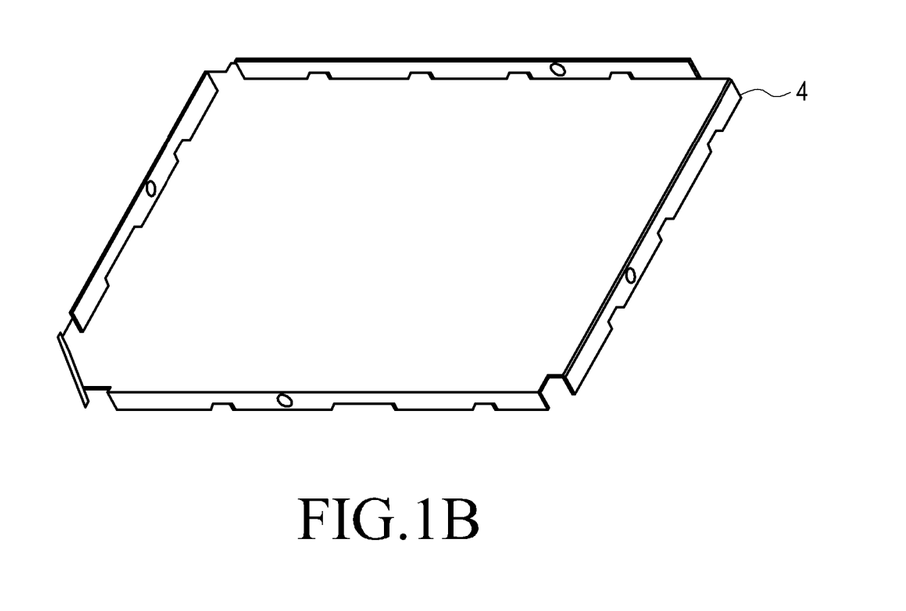

FIGS. 1A and 1B illustrate various shield structures according to an embodiment of the present disclosure.

Referring to FIG. 1A, a shielding may be formed by applying a gasket 102. The gasket 102 may have a shock absorbing property and be made of a conductive material. The gasket 102 may be applied on a bracket 2 to contact the ground of a PCB. In addition, application of the gasket 102 may lower contact resistance between the bracket 2 and the PCB to thereby increase coverage.

Referring to FIG. 1B, a shielding may be implemented as a shield can 4. Side walls of the shield can 4 may include protruded portions. If the protruded portions of the shield can 4 are fixed on a PCB, noise generated from components surrounded by the shield can 4 may be shielded.

The shield can 4 may be fixed by a method of mounting a Surface Mount Device (SMD) on a PCB and then fixing a shield can on the SMD. For example, if a clip is used as a SMD and fixed on a PCB, a part of a shield can may be inserted into and fixed by the clip. Alternatively, the shield can 4 may be fixed by a method of bending the edges of a shield can, forming screw holes in the bent portions, and then coupling screws with the screw holes such that current flows between the shield can and a PCB.

Meanwhile, since the gasket 102 has the shock absorbing property, the gasket 102 may form lumps or be scattered during processing, resulting in non-uniform application at some regions. If the gasket 102 is non-uniformly applied, RF signals may leak out.

A shield structure of using a shield can that is inserted into clips or coupled with screw holes may require complex process operations. Meanwhile, since most of electronic devices are mass-produced, it is difficult to determine coupling of screws every processing operation. Also, there may be cases in which wrong coupling of some screws is caused by an operator. Furthermore, a shield can having a thin, wide area is easy to be bent due to its morphometric characteristics. Moreover, the shield can may be bent during processing or by an impact applied by a user. Accordingly, if a PCB is coupled with an edge portion or a bent portion of a shield can, contact fault may occur, resulting in deterioration of shield performance of the corresponding electronic device. As a large area PCB is used, there is a case in which a part of a PCB is bent. In this case, when the PCB is shielded, a contact between the bent portion of the PCB and a shielding is less than a normal contact, which leads to contact fault. This may cause performance deterioration of the electronic device including the PCB.

In order to address this issue, a method and an apparatus for determining a shield state may determine a shield state with respect to a shielding through a detecting pad. For example, a detecting pad may be installed at an area at which a contact is expected to be imperfect to detect an electrical signal from the area. Accordingly, a shield state of an area at which a shield state is expected to be imperfect can be determined before a shielding is completely assembled and test post-processing is completed.

Hereinafter, a method and an apparatus of determining a shield state by a shielding will be described with reference to the appended drawings.

Figure 2:
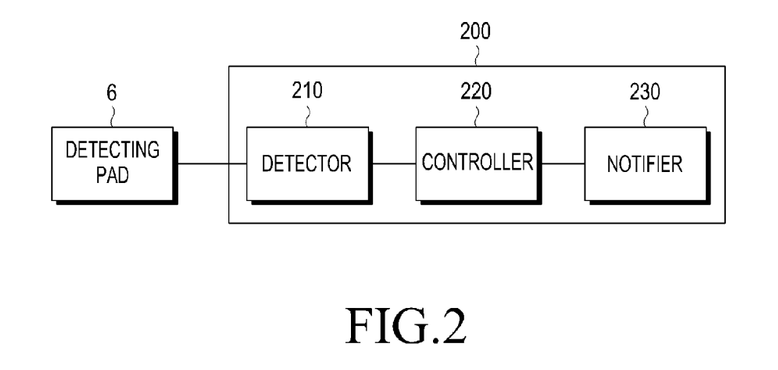
FIG. 2 is a block diagram illustrating a shield state determining apparatus according to an embodiment of the present disclosure.

FIG. 2 is a block diagram illustrating a shield state determining apparatus according to an embodiment of the present disclosure.

Referring to FIG. 2, a shield state determining apparatus 200 may include a detector 210, a controller 220, and a notifier 230.

The detector 210 may contact a detecting pad 6 installed on a PCB covered with a shielding. The detector 210 may contact the detecting pad 6 to detect a voltage or current according to a contact state between the shielding and the ground. The voltage or current may be detected depending on contact resistance between the shielding, the ground, and the detecting pad 6. The detector 210 may transfer a value of the detected voltage or current to the controller 220.

The controller 220 may control overall operations of the shield state determining apparatus 200. According to various embodiments of the present disclosure, if the controller 220 determines that the detector 210 contacts the detecting pad 6, the controller 220 may control the detector 210 to detect an electrical signal detected through the detecting pad 6. The electrical signal may represent a voltage or current according to contact resistance between the shielding and the ground or between the shielding and the detecting pad 6. The controller 220 may determine the voltage or current according to the contact state, transferred from the detector 210, and determine a shield state of a shield structure based on the voltage or current. A method in which the controller 220 determines a shield state will be described with reference to FIGS. 5 to 8.

In addition, the controller 220 may control the notifier 230 to output information about the shield state. For example, the controller 220 may control the notifier 230 to output a message informing of the determined shield state.

If the notifier 230 outputs information about the shield state, a user of the shield state determining apparatus 200 can determine a shield state by the shielding based on the information about the shield state. In addition, the controller 220 may store the information about the shield state. As not shown in FIG. 2, the shield state determining apparatus 200 may further include a memory. By storing information about a shield state in the memory, the user of the shield state determining apparatus 200 can determine a previous shield state by a specific shielding.

Figure 3:
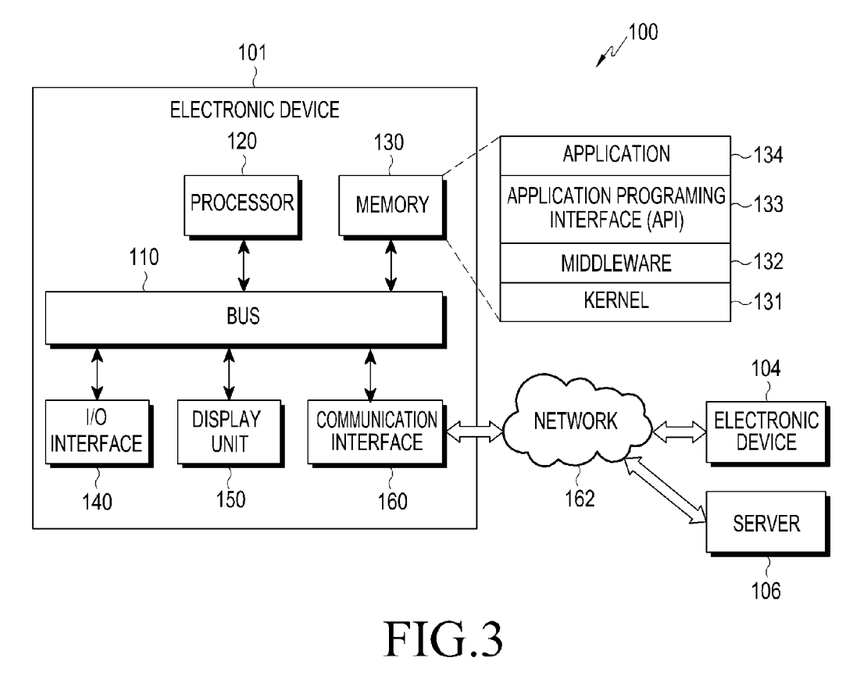
FIG. 3 is a block diagram illustrating an electronic device to which various embodiments of the present disclosure are applied, and a network environment including the electronic device according to an embodiment of the present disclosure.

FIG. 3 is a block diagram illustrating an electronic device to which various embodiments of the present disclosure are applied, and a network environment including the electronic device according to an embodiment of the present disclosure.

Referring to FIG. 3, an electronic device 101 may include a bus 110, a processor 120, a memory 130, an input/output interface 140, a display unit 150, and a communication interface 160. The bus 110 may be a circuit to connect the aforementioned components to each other, and to allow communications (for example, transmission of control messages) between the aforementioned components.

The processor 120 may receive commands from the aforementioned components (for example, the memory 130, the input/output interface 140, the display unit 150, or the communication interface 160) through the bus 110, interpret the received commands, and perform operations or data processing according to the interpreted commands.

The memory 130 may store commands or data received from or created by the processor 120 or the components (for example, the input/output interface 140, the display unit 150, or the communication interface 160). The memory 130 may include programming modules, such as, for example, a kernel 131, middleware 132, an Application Programming Interface (API) 133, an application 134 and the like. Each of the programming modules may be software, firmware, hardware, or a combination of two or more of the aforementioned devices.

The kernel 131 may control or manage system resources (for example, the bus 110, the processor 120, or the memory 130) which the other programming modules (for example, the middleware 132, the API 133, or the application 134) use to execute their operations or functions. In addition, the kernel 131 may provide an interface to enable the middleware 132, the API 133, or the application 134 to access individual components of the electronic device 100 and to control or manage the components.

The middleware 132 may act as an intermediary so that the API 133 or the application 134 can communicate with the kernel 131 to receive/transmit data from/to the kernel 131. In addition, the middleware 132 may perform, when operation requests are received from the application 134 (or a plurality of applications 134), controlling for the operation requests, for example, by allocating priority capable of using a system resource (for example, the bus 110, the processor 120, or the memory 130) of the electronic device 100 to the application 134 (at least one of the plurality of applications 134).

The API 133 may be an interface that enables the application 134 to control functions that are provided by the kernel 131 or the middleware 132. The API 133 may include at least one interface or function (for example, commands), for example, for file control, window control, image processing, character control, and the like.

The input/output interface 140 may transfer a command or data received from a user through an input/output device (for example, a sensor, a keyboard, or a touch screen) to the processor 120, the memory 130, or the communication interface 160, for example, through the bus 110. For example, the input/output interface 140 may provide data about a user's touch input received through a touch screen to the processor 120. An input device of the input/output interface 140 may include a touch panel, a (digital) pen sensor, a key, or an ultrasonic input device. The touch panel may be a capacitive type, a resistive type, an infrared type, or an ultrasonic type. The touch panel may further include a control circuit. If the touch panel is a capacitive type, the touch panel can recognize proximity as well as a direct touch input. The touch panel may further include a tactile layer. In this case, the touch panel may give a user tactile impression. The input/output interface 140 may output a command or data received from the processor 120, the memory 130, or the communication interface 160, for example, via the bus 110, through an input/output device (for example, a speaker or a display).

The display unit 150 may display various information (for example, multimedia data or text data) for a user. In addition, the display unit 150 may display a screen (for example, a wallpaper or a home screen) consisting of areas in which objects are arranged in a plurality of rows.

The communication interface 160 may enable the electronic device 101 to communicate with an external electronic device (for example, the electronic device 104 or a server 106). For example, the communication interface 160 may connect to a network 162 through wired or wireless communication to communicate with the external electronic device. The wireless communication may include at least one of Wireless Fidelity (WiFi), WiFi Direct, Bluetooth (BT), Near Field Communication (NFC), GPS, and cellular communication (for example, Long-Term Evolution (LTE), Long-Term Evolution Advanced (LTE-A), Code Division Multiple Access (CDMA), Wideband Code Division Multiple Access (WCDMA), Universal Mobile Telecommunications System (UMTS), Wireless Broadband (WiBro), Global System for Mobile Communications (GSM), and the like). The wired communication may include at least one of a Universal Serial Bus (USB), a High Definition Multimedia Interface (HDMI), Recommended Standard 232 (RS-232), and a Plain Old Telephone Service (POTS).

According to an embodiment of the present disclosure, the network 162 may be a telecommunication network. The communication network may include at least one of a computer network, the Internet, the Internet of Thing (IoT), and a telephone network. According to an embodiment of the present disclosure, a protocol (for example, a transport layer protocol, a data link protocol, or a physical layer protocol) for communication between the electronic device 101 and an external electronic device may be supported by at least one of the application 134, the API 133, the middleware 132, the kernel 131, and the communication interface 160.

Each of the above-described units of the electronic device 101 may be configured with one or more components, and the units may be termed according to a kind of the corresponding electronic device. The electronic device 101 may include at least one of the above-described units. In addition, the electronic device 101 may omit some of the above-described units or further include another unit(s). Furthermore, some of the units of the electronic device 101 may be combined to constitute entity which performs the same functions as the corresponding units.

The term "module" used in the present disclosure may indicate a unit including, for example, hardware, software, firmware, or a combination thereof. The "module" may be interchangeably used with another term, such as "unit", "logic", "logical block", "component", "circuit", and the like. The "module" may be a minimum unit or a part of components integrated into one body. Moreover, the "module" may be a minimum unit or a part for performing one or more functions. The "module" may be implemented mechanically or electronically. For example, the "module" may include at least one of an Application-Specific Integrated Circuit (ASIC) chip, Field-Programmable Gate Arrays (FPGAs), or a programmable-logic device, which performs certain operations, already developed or to be developed in future.

According to various embodiments of the present disclosure, at least one part of an apparatus (for example, modules or their functions) or a method (for example, operations) may be implemented as an instruction stored in computer-readable storage media, for example, in the form of a programming module. When the instruction is executed by one or more processors (for example, the processor 120), the one or more processors may perform a function corresponding to the instruction. The computer-readable storage media may be, for example, the memory 130. At least one part of the programming module may be implemented (for example, executed) by the processor 120. At least one of the programming module may include a module, a program, a routine, sets of instructions, or a processor for performing one or more functions.

The computer-readable storage media may include magnetic media (for example, a hard disk, a floppy disk, and a magnetic tape), optical media (for example, Compact Disc Read Only Memory (CD-ROM) and Digital Versatile Disc (DVD)), magneto-optical media (for example, floptical disk), and hardware device (for example, Read Only Memory (ROM), and Random Access Memory (RAM), and flash memory) specifically configured to store and perform a program instruction (for example, a programming module). The programming instruction may include a high-level language code that can be executed by a computer using an interpreter, as well as a machine code that is created by a compiler. The hardware device may be configured to operate as at least one software module for performing operations according to various embodiments of the present disclosure, and vice versa.

Figure 4:
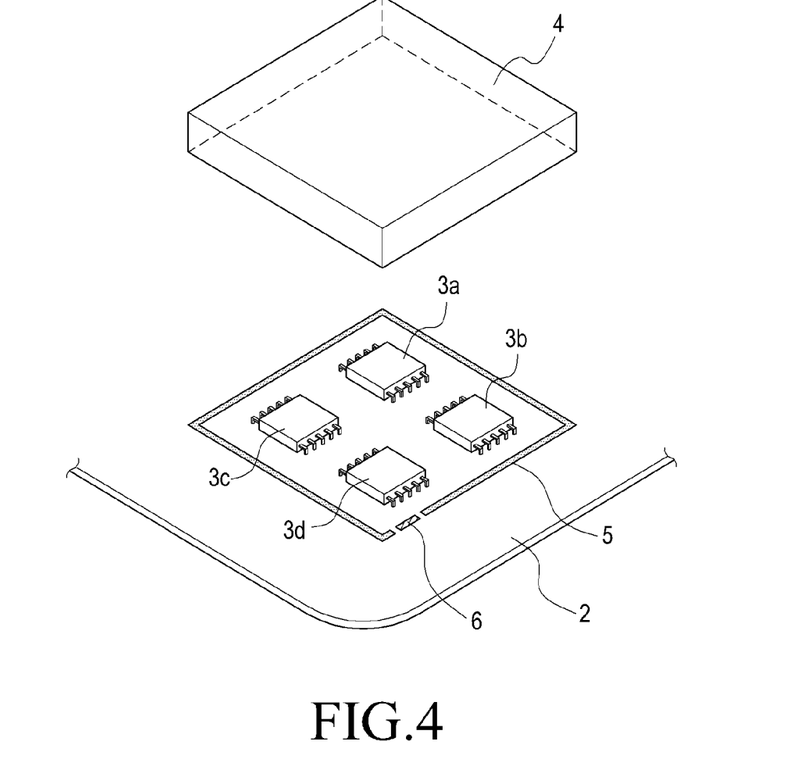
FIG. 4 is an exploded perspective view illustrating a shield structure to which a shield state determining method is applied according to an embodiment of the present disclosure.

FIG. 4 is an exploded perspective view illustrating a shield structure to which a shield state determining method is applied according to an embodiment of the present disclosure.

Referring to FIG. 4, a case in which a plurality of elements 3a, 3b, 3c, and 3d are mounted on a PCB 2 included in an electronic device (not shown) is assumed. The elements 3a, 3b, 3c, and 3d may be surrounded by a ground wall 5, and a shield can 4 may be placed on the ground wall 5 to shield the elements 3a, 3b, 3c, and 3d.

According to an embodiment of the present disclosure, the PCB 2 may include a detecting pad 6. For example, the detecting pad 6 may be positioned on an area at which the ground wall 5 is broken. Accordingly, a shield state determining apparatus may detect an electrical signal detected through the detecting pad 6 to determine a shield state between the ground wall 5 and the shield can 4.

The detecting pad 6 may be installed at an area on the PCB 2, at which a contact to the shield can 4 is expected to be imperfect. Accordingly, the shield state determining apparatus may detect an electrical signal detected through the detecting pad 6 to determine a shield state of an area at which a contact is expected to be imperfect.

A method in which the shield state determining apparatus determines a shield state through the detecting pad 6 will be described with reference to FIG. 5.

Figure 5:
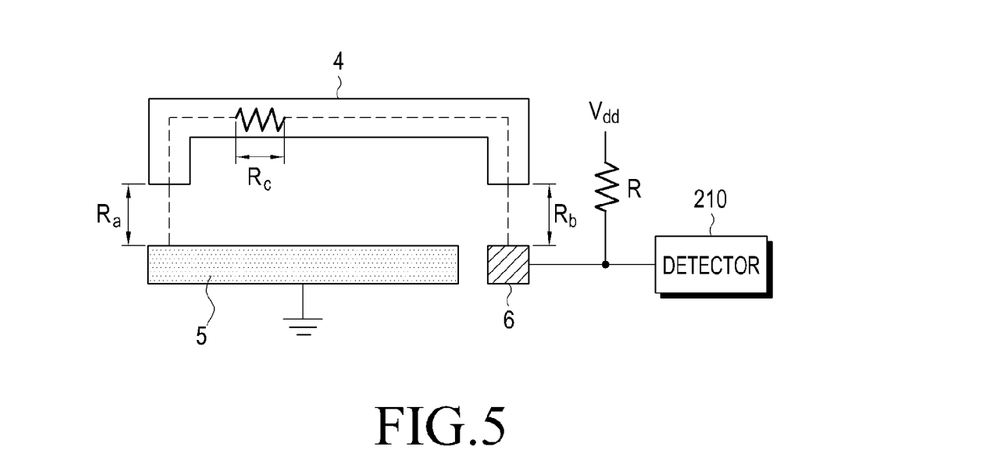
FIG. 5 is a circuit diagram of a configuration for enabling a shield state determining apparatus to determine a shield state according to an embodiment of the present disclosure.

FIG. 5 is a circuit diagram of a configuration for enabling a shield state determining apparatus to determine a shield state according to an embodiment of the present disclosure.

Referring to FIG. 5, the shield can 4 of the electronic device may be mounted to contact the ground wall 5 and the detecting pad 6.

The detector 210 may detect a voltage Vdet detected through a contact between the detecting pad 6 and the shield can 4. The voltage Vdet may be a voltage value obtained by summing contact resistance Ra between the shield can 4 and the ground wall 5, contact resistance Rb between the shield can 4 and the detecting pad 6, and internal resistance Rc of the shield can 4. The detector 210 may transfer the voltage Vdet to the controller 220. The controller 220 may compare the voltage Vdet to a reference voltage Vref to determine a shield state of a shield structure. The reference voltage Vref may be set in advance by a manufacturing company. Any one of voltage values that are detected when a contact state is imperfect, among voltage values that are detected according to contact states of the shield structure, may be set to the reference voltage Vref.

For example, if a contact between the shield can 4 and the PCB 2 is normal, the contact resistance Ra, Rb, and Rc may be zero or a value close to zero. Accordingly, the voltage Vdet will be less than the reference voltage Vref. If the controller 220 determines that the voltage Vdet is less than the reference voltage Vref, the controller 220 may determine that a shield state is normal, and notify the notifier 230 of the normal shield state.

In contrast, if a contact between the shield can 4 and the PCB 2 is faulty, the contact resistance Ra or Rb becomes greater than when a contact between the shield can 4 and the PCB 2 is perfect. In this case, the voltage Vdet may be detected as a voltage that is equal to or greater than the reference voltage Vref. If the controller 220 determines that the voltage Vdet is equal to or greater than the reference voltage Vref, the controller 220 may determine that a shield state is abnormal, and notify the notifier 230 of the abnormal shield state.

Figure 6:
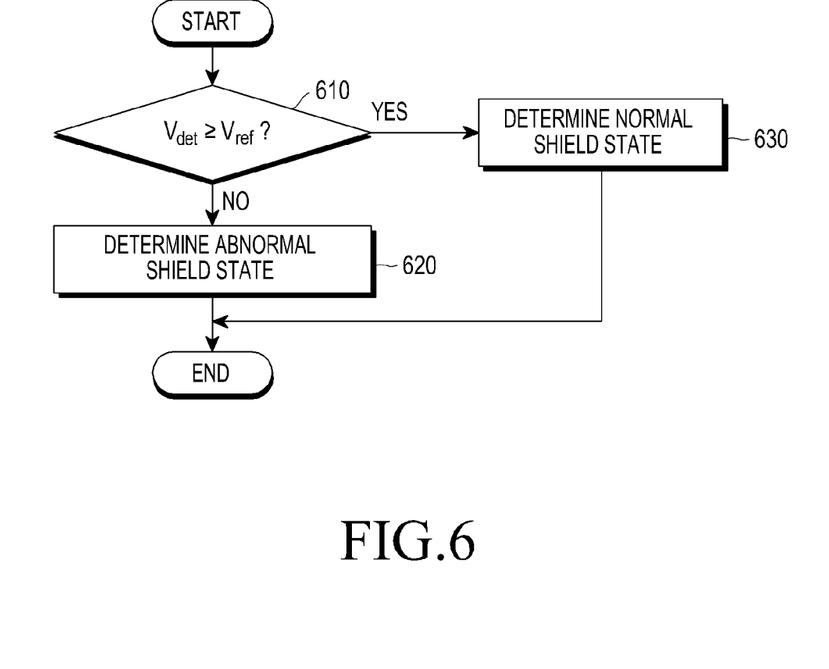
FIG. 6 is a flowchart illustrating a method in which a shield state determining apparatus determines a shield state according to an embodiment of the present disclosure.

FIG. 6 is a flowchart illustrating a method in which a shield state determining apparatus determines a shield state according to an embodiment of the present disclosure.

Referring to FIGS. 2 and 6, in operation 610, the controller 220 of the shield state determining apparatus may compare a detected voltage Vdet with a reference voltage Vref, wherein the detected voltage Vdet may be a voltage detected by the detector 210 through the detecting pad 6.

If the controller 220 determines in operation 610 that the detected voltage Vdet is equal to or greater than the reference voltage Vref, the controller 220 may determine that a shield state of the corresponding electronic device is abnormal, in operation 620.

In contrast, if the controller 220 determines in operation 610 that the detected voltage Vdet is less than the reference voltage Vref, the controller 220 may determine that a shield state of the corresponding electronic device is normal, in operation 630.

Figure 7:
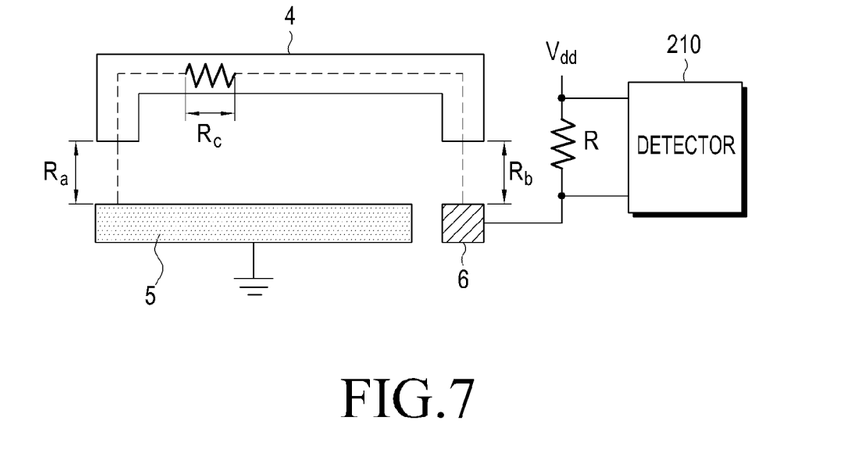
FIG. 7 is a circuit diagram of a configuration for enabling a shield state determining apparatus to determine a shield state according to an embodiment of the present disclosure.

FIG. 7 is a circuit diagram of a configuration for enabling a shield state determining apparatus to determine a shield state according to an embodiment of the present disclosure.

Referring to FIGS. 2 and 7, the shield can 4 of the electronic device may be mounted to contact the ground wall 5 and the detecting pad 6. If a voltage Vdd is applied to a resistor R connected to the detecting pad 6, the detector 210 of the shield state determining apparatus may measure current according to an electrical signal detected through the detecting pad 6 to determine a shield state between the shield can 4 and the ground wall 5.

For example, the detector 210 may detect current Idet detected through a contact between the detecting pad 6 and the shield can 4. The current Idet may be current flowing through the resistor R according to contact resistance Ra between the shield can 4 and the ground wall 5, contact resistance Rb between the shield can 4 and the detecting pad 6, and internal resistance R of the shield can 4.

Thereafter, the detector 210 may transfer the current Idet to the controller 220. The controller 220 may compare the current Idet to a reference current Iref to determine a shield state. The reference current Iref may be set in advance by a manufacturing company. Any one of current values that are detected when a contact state is imperfect, among current values that are detected according to contact states of the shield structure, may be set to the reference voltage Vref.

For example, if a contact between the shield can 4 and the PCB 2 is perfect, the contact resistance Ra or Rb will be zero or a value close to zero. Accordingly, the current Idet will be greater than the reference current Iref. If the controller 220 determines that the current Idet is greater than the reference current Iref, the controller 220 may determine that a shield state is normal, and notify the notifier 230 of the normal shield state.

In contrast, if a contact between the shield can 4 and the PCB 2 is imperfect, the contact resistance Ra or Rb will be greater than when a contact between the shield can 4 and the PCB 2 is perfect. In this case, the current Idet will be measured as current that is equal to or less than the reference current Iref. If the controller 220 determines that the current Idet is equal to or less than the reference current Iref, the controller 220 may determine that a shield state is abnormal, and notify the notifier 230 of the abnormal shield state.

Figure 8:
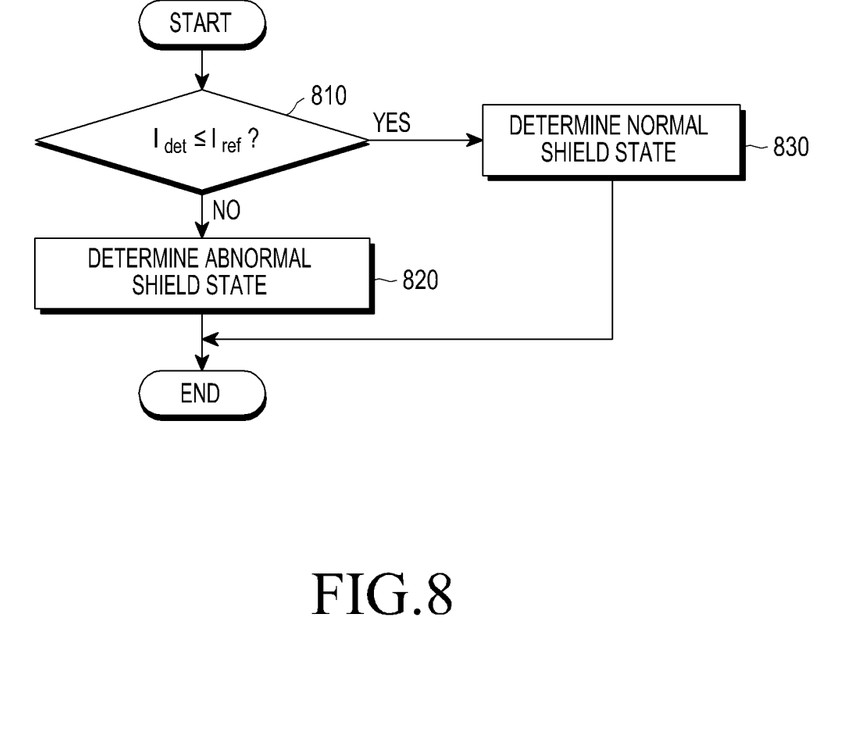
FIG. 8 is a flowchart illustrating a method in which a shield state determining apparatus determines a shield state according to an embodiment of the present disclosure.

FIG. 8 is a flowchart illustrating a method in which a shield state determining apparatus determines a shield state according to an embodiment of the present disclosure.

Referring to FIGS. 2 and 8, in operation 810, the controller 220 of the shield state determining apparatus may compare detected current Idet to reference current Iref.

If the controller 220 determines in operation 810 that the detected current Idet is equal to or less than the reference current Iref, the controller 220 may determine that a shied state of the electronic device is abnormal, in operation 820.

In contrast, if the controller 220 determines in operation 810 that the detected current Idet is greater than the reference current Iref, the controller 220 may determine that a shield state of the electronic device is normal, in operation 830.

Figure 9:
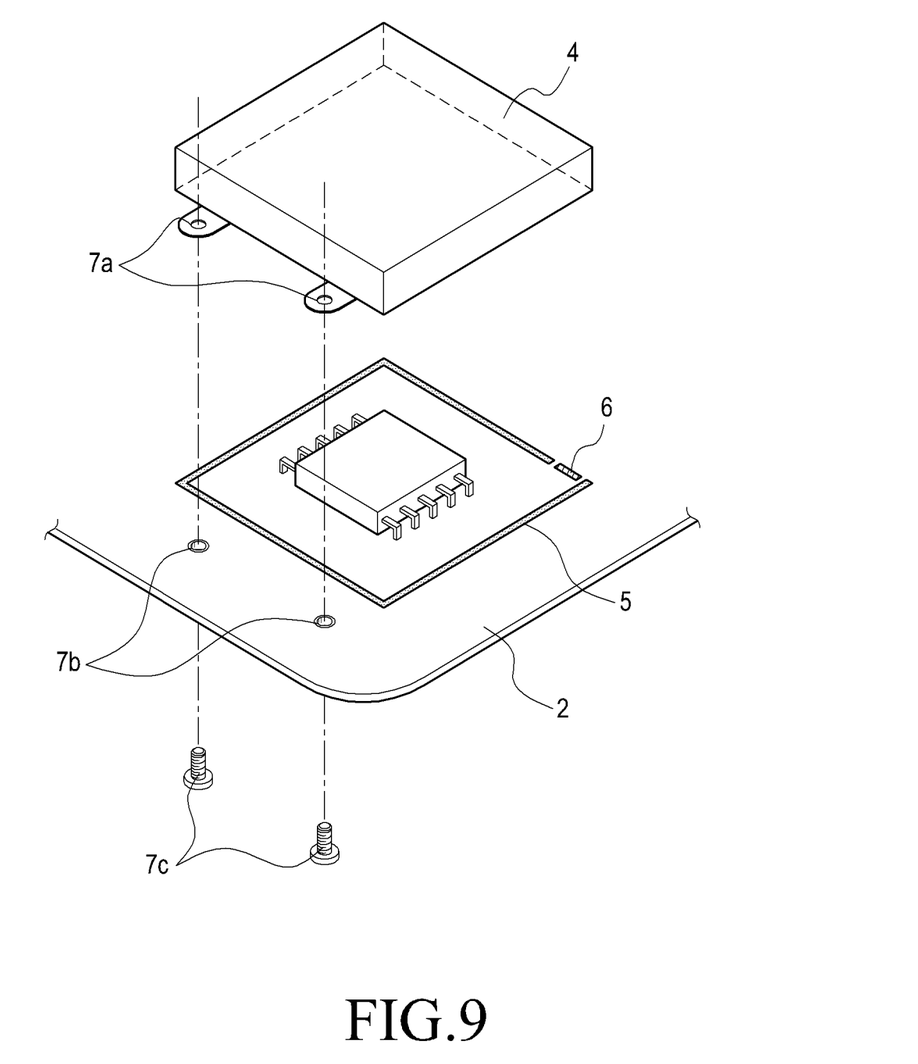
FIG. 9 is an exploded perspective view illustrating a shield structure to which a shield state determining method is applied according to an embodiment of the present disclosure.

FIG. 9 is an exploded perspective view illustrating a shield structure to which a shield state determining method is applied according to an embodiment of the present disclosure.

Referring to FIG. 9, a pair of brackets 7a may be attached to one side of a shield can 4, and in a PCB 2 may be formed a pair of holes 7b into which a pair of bolts 7c for fixing the brackets 7a are inserted. Since the shied can 4 is fixed on the PCB 2 by the brackets 7a and the bolts 7c, element mounted on the PCB 2 may be shielded. Moreover, the PCB 2 may include a ground wall 5 and a detecting pad 6. The shield state determining apparatus may determine a shield state by the shield can 4 based on an electrical signal detected by the detecting pad 6.

Figure 10:
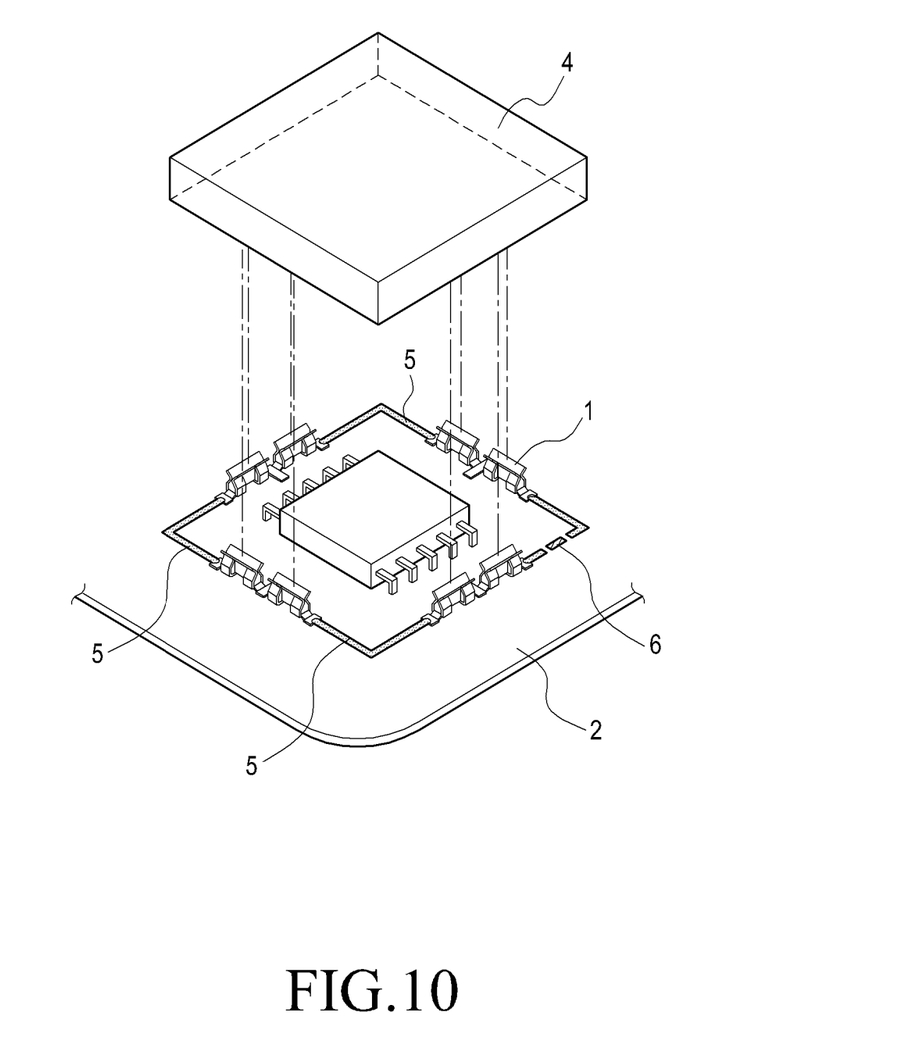
FIG. 10 is an exploded perspective view illustrating a shield structure to which a shield state determining method is applied according to an embodiment of the present disclosure.

FIG. 10 is an exploded perspective view illustrating a shield structure to which a shield state determining method is applied according to an embodiment of the present disclosure.

Referring to FIG. 10, a PCB 2 may include one or more clips 1 to fix a shield can 4. Since at least one side of the shield can 4 is penetrated and fixed by the one or more clips 1, elements mounted on the PCB 2 may be shielded. According to an embodiment of the present disclosure, the PCB 2 may include a ground wall 5 and a detecting pad 6. According to an embodiment of the present disclosure, the shield state determining apparatus may determine a shield state by the shield can 4 based on an electrical signal detected through the detecting pad 6.

Figure 11:
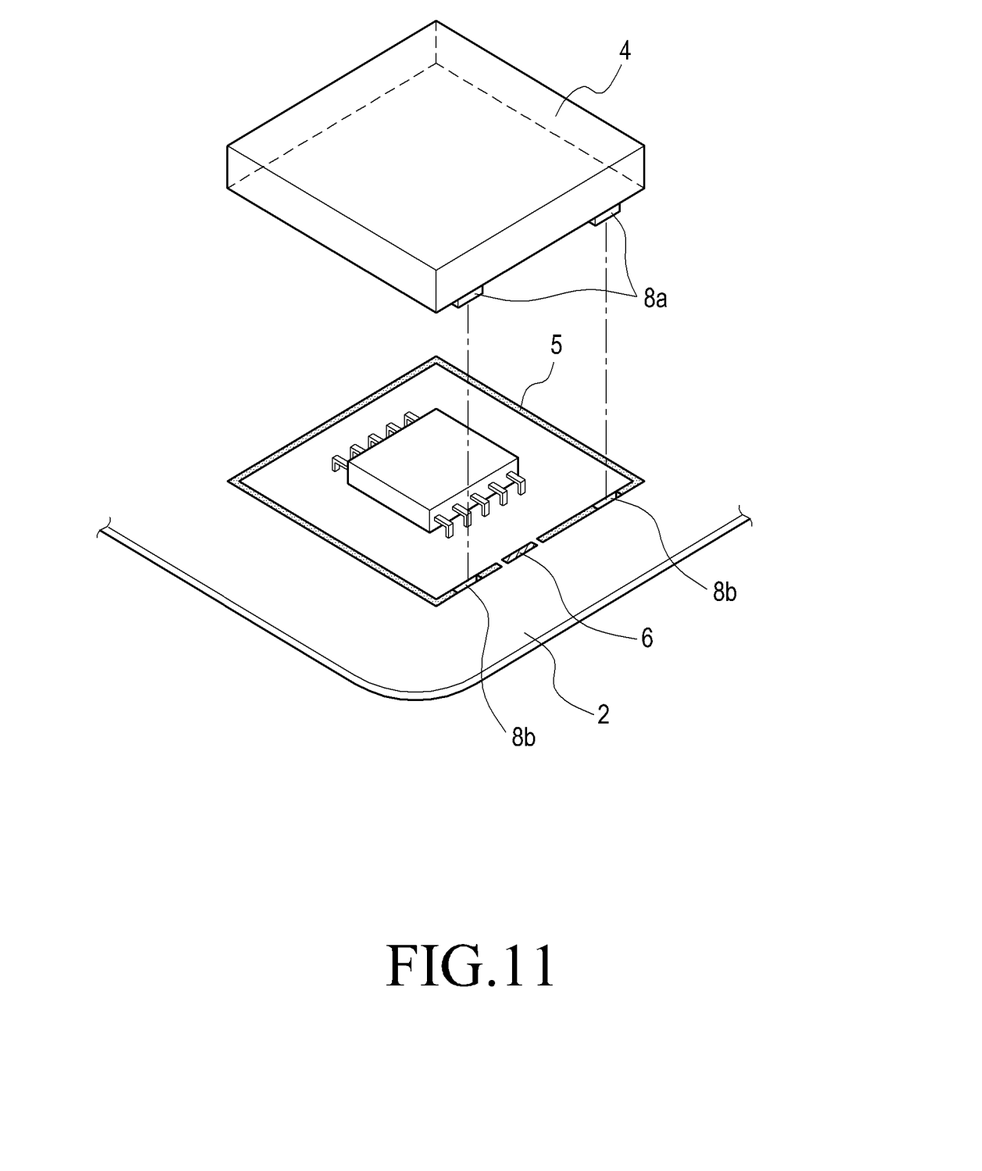
FIG. 11 is an exploded perspective view illustrating a shield structure to which a shield state determining method is applied according to an embodiment of the present disclosure.

FIG. 11 is an exploded perspective view illustrating a shield structure to which a shield state determining method is applied according to an embodiment of the present disclosure.

Referring to FIG. 11, in a side of a shield can 4 may be formed one or more protrusions 8a, and in a PCB 2 may be formed one or more slots 8b into which the protrusions 8a are inserted. Since the protrusions 8a of the shield can 4 are inserted into and fixed in the one or more slots 8b, elements mounted on the PCB 2 may be shielded. According to an embodiment of the present disclosure, the PCB 2 may include a ground wall 5 and a detecting pad 6. The shield state determining apparatus may determine a shield state by the shield can 4 based on an electrical signal detected through the detecting pad 6.

The shield state determining method and apparatus may be configured as described above, however, the embodiments of the present disclosure as described above are to cover all modifications, equivalents, and alternatives falling within the spirit and scope of the disclosure.

An operation method of an electronic device may include operations of at a detecting pad, detecting an electrical signal corresponding to a contact state of a shielding that contacts a ground or the detecting pad, and determining a shield state by the shielding based on the detected electrical signal.

For example, the method of determining the shield state may include operations of detecting a voltage corresponding to the contact state from the electronic signal, and if the detected voltage is equal to or greater than a reference voltage, determining that the shield state by the shielding is abnormal. Meanwhile, the method of determining the shield state may further include, if the detected voltage is less than the reference voltage, determining that the shield state by the shielding is normal.

As another example, the method of determining the shield state may include operations of detecting current corresponding to the contact state from the electronic signal, and if the detected current is equal to or less than a reference current, determining that the shield state by the shielding is abnormal. Meanwhile, the method of determining the shield state may further include, if the detected current is greater than the reference current, determining that the shield state by the shielding is normal.

The operation method of the electronic device may further include outputting a message informing of the determined shield state.

The operation method of the electronic device may further include storing information about the determined shield state in a storage unit of the electronic device.

An electronic device may include a detector configured to detect, through a detecting pad, an electrical signal corresponding to a contact state of a shielding that contacts a ground or the detecting pad, and a controller configured to determine a shield state by the shielding based on the detected electrical signal.

The controller of the electronic device may perform operations of controlling the detector to detect a voltage corresponding to the contact state from the electronic signal, and if the detected voltage is equal to or greater than a reference voltage, determining that the shield state by the shielding is abnormal. Meanwhile, the controller may further include, if the detected voltage is less than the reference voltage, determining that the shield state by the shielding is normal.

The controller of the electronic device may perform operations of controlling the detector to detect current corresponding to the contact state from the electrical signal, and if the detected current is equal to or less than the current, determining that the shield state by the shielding is abnormal. Meanwhile, the controller may further perform, if the detected current is greater than the current, determining that the shield state by the shielding is normal.

The controller of the electronic device may further perform controlling the notifier to output information about the determined shield state.

The controller of the electronic device may further perform controlling a memory to store the information about the determined shield state.

The electronic device may include a detecting pad, a ground, and a shielding, wherein the shielding may contact the detecting pad and the ground, and a contact state between the shielding, the detecting pad, and the ground may be determined through the detecting pad.

For example, the above description relates to a case in which the shield structure is applied to a PCB. However, the shield structure may be applied to any kind of a board with a ground.

The above description relates to a case in which a shielding is a shield can, however, the shielding may be any kind of shielding to contact a ground of a board for shielding.

As described above, by determining a shield state of a shield structure upon assembling a shielding, it is possible to reduce a time consumed for a manufacturing process and process loss due to reworking that is performed after manufacturing.

According to various embodiments of the present disclosure, a detecting pad may be installed at an area at which a shield state is expected to be imperfect. Thereafter, by determining a shield state through the detecting pad, it is possible to determine a shield state of an area at which a shield state is expected to be imperfect before a shielding is completely assembled.

Various embodiments of the present disclosure may be realized in the form of hardware, software, or a combination of hardware and software. Any such software may be stored in a volatile or a non-volatile storage, such as, for example, an erasable or rewritable ROM, in memory, such as, for example, a RAM, memory chips, device or integrated circuits, or in an optically or magnetically writable, machine (e.g., a computer)-readable medium, such as, for example, a Compact Disk (CD), a Digital Versatile Disk (DVD), a magnetic disk, a magnetic tape, or the like. A memory that can be included in a mobile terminal is an example of a machine-readable storage medium suitable to store a program or programs including instructions for implementing various embodiments of the present disclosure. Accordingly, the methods include a program comprising code for implementing an apparatus or a method as claimed in any one of the claims of this specification and a machine-readable storage storing such a program. Still further, such programs may be conveyed electronically via any medium, such as a communication signal carried over a wired or wireless connection and embodiments suitably encompass the same.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for performing fault analysis in an electronic device, the electronic device comprising a ground wall surrounding at least one component of the electronic device, a shielding connected with the ground wall to shield noise generated from the at least one component, and a detecting pad positioned in at least part of an area at which the ground wall is broken, the method comprising:
   detecting, at the detecting pad configured to be in contact with at least part of the shielding, an electrical signal corresponding to a contact state of the shielding and the ground wall; and
   determining a contact state between the shielding, the detecting pad, and the ground wall based on the electrical signal detected by the detecting pad,
   wherein the detecting pad is configured to be in contact with at least part of the shielding, and
   wherein the at least part of the area of which the detecting pad is positioned is in between surface mount devices which are mounted on a board for fixing the shielding on the board.

2. The method of claim 1, wherein the determining of the shield state comprises:
   detecting a voltage corresponding to the contact state from the electrical signal; and
   if the detected voltage is equal to or greater than a reference voltage, determining that the shield state by the shielding is abnormal.

3. The method of claim 2, wherein the determining of the shield state further comprises, if the detected voltage is less than the reference voltage, determining that the shield state by the shielding is normal.

4. The method of claim 1, wherein the determining of the shielding state comprises:
   detecting current corresponding to the contact state from the electronic signal; and
   if the detected current is equal to or less than reference current, determining that the shield state by the shielding is abnormal.

5. The method of claim 4, wherein the determining of the shielding state comprises, if the detected current is greater than the reference current, determining that the shield state by the shielding is normal.

6. The method of claim 1, further comprising outputting a message informing of the determined shield state.

7. The method of claim 1, further comprising storing information about the determined shield state in a memory of the electronic device.

8. The method of claim 1, wherein the shielding comprises a shield can.

9. The method of claim 8, further comprising:
   detecting an electrical signal detected through the detecting pad to determine a shield state between the ground wall and the shield can.

10. An electronic device comprising:
    a ground wall surrounding at least one component of the electronic device;
    a shielding connected with the ground wall to shield noise generated from the at least one component;
    surface mount devices mounted on a board for fixing the shielding on the board;
    a detecting pad positioned in at least part of an area at which the ground wall is broken;
    a detector configured to:
       be in contact with at least part of the shielding, and
       detect, through the detecting pad, an electrical signal corresponding to a contact state between the shielding, the detecting pad, and the ground wall; and
    at least one processor configured to determine the contact state based on the detected electrical signal,
    wherein the detecting pad is configured to be in contact with at least part of the shielding, and
    wherein the at least part of the area of which the detecting pad is positioned is in between surface mount devices.

11. The electronic device of claim 10, wherein the at least one processor is further configured to:
    control the detector to detect a voltage corresponding to the contact state from the electrical signal; and
    determine, if the detected voltage is equal to or greater than a reference voltage, that the shield state by the shielding is abnormal.

12. The electronic device of claim 11, wherein the at least one processor is further configured to determine that the shield state by the shielding is normal if the detected voltage is less than the reference voltage.

13. The electronic device of claim 10, wherein the at least one processor is further configured to:
control the detector to detect current corresponding to the contact state from the electrical signal; and
determine, if the detected current is equal to or less than a reference current, that the shield state by the shielding is abnormal.

14. The electronic device of claim 13, wherein the at least one processor is further configured to determine that the shield state by the shielding is normal if the detected current is greater than the reference current.

15. The electronic device of claim 10, wherein the at least one processor is further configured to control a notifier to output information about the determined shield state.

16. The electronic device of claim 10, further comprising a memory,
wherein the at least one processor is further configured to control the memory to store information about the determined shield state.

17. An electronic device comprising:
a detecting pad positioned in at least part of an area at which a ground wall is broken;
the ground wall surrounding at least one component of the electronic device;
a shielding connected with the ground wall to shield noise generated from the at least one component;
surface mount devices mounted on a board for fixing the shielding on the board; and
a processor configured to, at the detecting pad configured to be in contact with at least part of the shielding, detect an electrical signal corresponding to a contact state of the shielding and the ground wall and determine the contact state between the shielding, the detecting pad, and the ground wall based on the electrical signal detected by the detecting pad,
wherein the detecting pad is configured to be in contact with at least part of the shielding, and
wherein the at least part of the area of which the detecting pad is positioned is in between surface mount devices.

18. The electronic device of claim 10, wherein the shielding comprises a shield can.

19. The electronic device of claim 18, wherein the detector detects an electrical signal detected through the detecting pad to determine a shield state between the ground wall and the shield can.

20. The electronic device of claim 17, wherein the shielding comprises a shield can.

21. The electronic device of claim 20, wherein a detector detects an electrical signal detected through the detecting pad to determine a shield state between the ground wall and the shield can.

* * * * *